United States Patent
Hsieh et al.

(10) Patent No.: US 6,907,306 B2
(45) Date of Patent: Jun. 14, 2005

(54) PROCESS TOOL THROUGHPUT MONITORING SYSTEM AND METHOD

(75) Inventors: Chiung-Fang Hsieh, Hsinchu (TW); Long-Fan Lin, Hsinchu (TW); Ching-Yi Chen, Hsinchu (TW); Ching-Feng Yeh, Hsinchu (TW); Chi-Yung Liu, Hsinchu (TW); Shu-Shung Lin, Hsinchu (TW)

(73) Assignee: Macronix International, Co., Ltd., Hsinchu (TW)

( * ) Notice: Subject to any disclaimer, the term of this patent is extended or adjusted under 35 U.S.C. 154(b) by 1 day.

(21) Appl. No.: 10/445,728

(22) Filed: May 27, 2003

(65) Prior Publication Data

US 2004/0243268 A1 Dec. 2, 2004

(51) Int. Cl.[7] .............................................. G06F 19/00
(52) U.S. Cl. ..................................... 700/108; 700/115
(58) Field of Search ................................ 700/108, 115

(56) References Cited

U.S. PATENT DOCUMENTS 6,549,822 B1 * 4/2003 Toprac ....................... 700/121
6,630,995 B1 * 10/2003 Hunter ...................... 356/237.5
6,662,066 B1 * 12/2003 Yu et al. ..................... 700/108
2002/0138169 A1 * 9/2002 Sakaguchi ................... 700/108
2004/0078310 A1 * 4/2004 Shaffer ......................... 705/35

* cited by examiner

Primary Examiner—Leo Picard
Assistant Examiner—Alexander Kosowski
(74) Attorney, Agent, or Firm—Stout, Uxa, Buyan & Mullins, LLP (57) ABSTRACT

A process tool monitoring system is disclosed including a retrieving module, a calculating module, and an output module. The retrieving module retrieves parameter data from a process tool. Where the process tool is a furnace, the parameter data may include furnace temperature data, times of day that wafers were loaded into the furnace, and times of day that wafers were unloaded from the furnace. The retrieving module stores the parameter data in a database, and the calculating module accesses the parameter data within the database, and calculates a present throughput data dependent upon the parameter data, wherein the present throughput data is indicative of a present throughput of the process tool. The output module provides the present throughput data to an operator of the process tool. The process tool monitoring system may be used to monitor multiple process tools, and to compare the throughputs of the multiple process tools.

23 Claims, 4 Drawing Sheets

PROCESS TOOL THROUGHPUT MONITORING SYSTEM AND METHOD

BACKGROUND OF THE INVENTION

1. Field of the Invention

The present invention relates generally to semiconductor fabrication systems and, more particularly, to semiconductor wafer fabrication systems including one or more process tools.

2. Description of Related Art

Integrated circuits are typically formed by processing several semiconductor wafers as a group or "lot" through a series of wafer fabrication process tools (hereafter, "process tools"). Each process tool typically performs a single wafer fabrication operation upon the semiconductor wafers. The integrated circuits formed in this manner are substantially identical to one another. Following wafer fabrication, the integrated circuits are typically subjected to functional testing, and then separated to form individual integrated circuits called "chips" or "die." Fully functional die are typically packaged and sold as individual units.

During operation of a process tool, one or more operating conditions are established within the process tool, typically dependent upon input (e.g., control signals) from a centralized manufacturing execution system (MES), or from a human operator. These operating conditions also typically affect a "throughput" of the process tool, where the throughput of the process tool is the number of semiconductor wafers processed by the process tool per unit of time.

For example, in a furnace process tool, a desired or "target" elevated temperature to be maintained within the furnace during operation is selected. In addition, a rate at which the temperature within the furnace is to rise after wafer loading may be selected, and a rate at which the temperature within the furnace is to decrease prior to wafer unloading may also be selected Input from a MES, or an operator of the furnace, may select the target temperature, the temperature "ramp-up" rate, and/or the temperature "ramp-down" rate.

A control system of the furnace is tasked with increasing the temperature within the furnace at the ramp-up rate and decreasing the temperature within the furnace at the ramp-down rate. The amount of time the one or more semiconductor wafers must remain in the furnace may depend on the ability of the furnace control system to establish the selected ramp-up rate and the ramp-down rate. In this situation, the throughput of the furnace is expectedly dependent upon the ability of the furnace control system to establish the selected ramp-up rate and the ramp-down rate. Delays of an operator will also affect the throughput. Due to fierce competition, semiconductor manufacturers are highly motivated to operate process tools at or near their maximum throughputs. In order to do so, semiconductor manufacturers must determine the relationships between throughputs of process tools, and the operating conditions established within the process tools during operation.

A typical MES is capable of performing many important functions, including work in process (WIP) tracking, resource allocation and status, operations scheduling, quality data collection, and process control. However, the typical MES is not configured to determine for example the throughputs of process tools.

A need thus exists in the prior art for means and methods of determining throughputs of process tools, and relationships between throughputs of process tools and operating conditions established within the process tools during operation.

SUMMARY OF THE INVENTION

A process tool monitoring system is disclosed including a retrieving module, a calculating module, and an output module. The retrieving module is in communication with the process tool, and retrieves parameter data from the process tool. In general, the parameter data comprises operating data of the process tool. For example, where the process tool is a furnace, the parameter data may include furnace temperature data, times of day that wafers were loaded into the furnace, and times of day that wafers were unloaded from the furnace.

The retrieving module stores the parameter data in a database. The calculating module accesses the parameter data within the database, and calculates a present throughput data dependent upon the parameter data, wherein the present throughput data is indicative of a present throughput of the process tool. The output module provides the present throughput data to an operator of the process tool.

In addition to the parameter data, the database may also store constant standard parameter data and real-time standard parameter data. The constant standard parameter data includes general processing-information (e.g., process tool identification information, recipe identification information, processing date, etc.), and the real-time standard parameter data includes average values of the parameter data. The calculating module may access the constant standard parameter data and the real-time standard parameter data within the database, and calculate a standard throughput data dependent upon the constant standard parameter data and the real-time standard parameter data. The standard throughput data is a measure of process tool throughput calculated using the real-time standard parameter data (i.e., based on average parameter values). The output module may provide the standard throughput data to the operator.

A process tool monitoring method includes retrieving the parameter data from the process tool, calculating the present throughput data dependent upon the parameter data, and providing the present throughput data to the operator. The monitoring system may also be used to monitor multiple process tools, and to compare the throughputs of the multiple process tools.

By providing throughput data, the monitoring system and the embodied process tool monitoring method can facilitate improvement of the wafer fabrication process.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of those embodiments as may fall within the spirit and scope of the invention as defined by the appended claims. It is to be understood and appreciated that the process steps and structures described herein do not cover a complete process flow for the semiconductor manufacturing monitoring system disclosed herein. The present invention may be practiced in conjunction with various semiconductor manufacturing techniques that are conventionally used in the art, and only so much of the commonly practiced process steps are included herein as are necessary to provide an understanding of the present invention.

Figure 1:
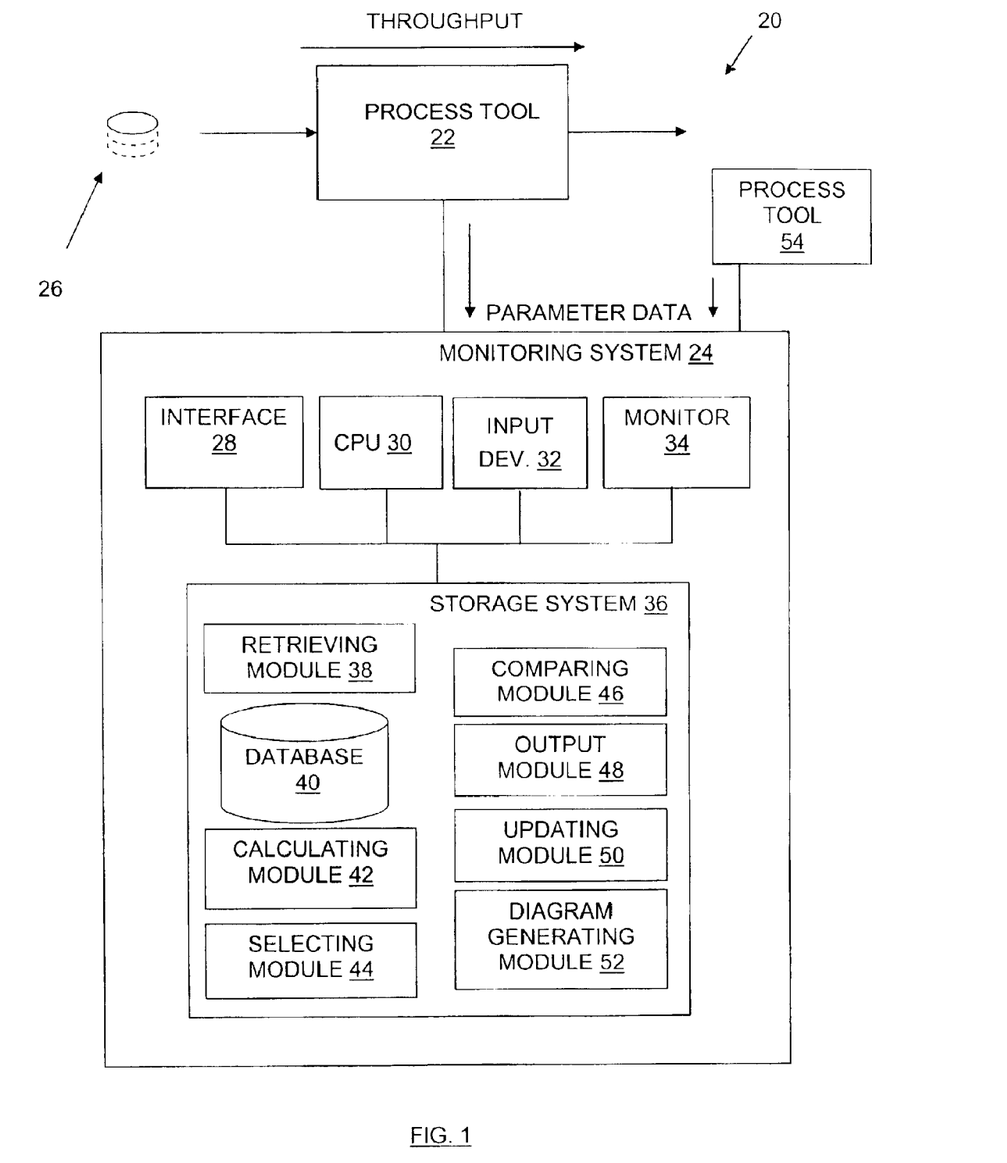
FIG. 1 illustrates one embodiment of a semiconductor wafer fabrication system including a wafer fabrication process tool.(i.e., process tool) operably coupled to, and in communication with, a monitoring system.

Referring more particularly to the drawings, FIG. 1 depicts an embodiment of a semiconductor wafer fabrication system 20 including a wafer fabrication process tool (i.e., process tool) 22 operably coupled to, and in communication with, a monitoring system 24. The process tool 22 is configured to receive one or more semiconductor wafers 26 of a wafer group or "lot." The process tool 22 is configured to perform a wafer fabrication operation on the semiconductor wafers 26, when positioned within the process tool 22, according to a predefined procedure (i.e., a predetermined set of steps or "recipe").

During the wafer fabrication operation, at least one surface of each of the one or more semiconductor wafers 26 is altered in some way. For example, the process tool 22 may be configured to perform a layering operation, a patterning operation, a doping operation, or a heat treatment upon the semiconductor wafers 26. A layering operation typically adds a layer of a desired material to an exposed surface of the semiconductor wafers. A patterning operation typically contributes to the removal of selected portions of one or more layers formed by layering. A doping operation typically places dopant atoms upon and within exposed surfaces of the semiconductor wafers, thereby producing p-n junctions required for semiconductor operation. A heat treatment operation is used to heat (e.g., anneal) semiconductor wafers.

In the embodiment of FIG. 1, the monitoring system 24 includes an interface 28, a central processing unit (CPU) 30, an input device 32, a display monitor (monitor) 34, and a storage system 36. The interface 28, the CPU 30, the input device 32, the monitor 34, and the storage system 36 are operably connected to, and in communication with, one another, and may form, for example, a conventional computer system.

The CPU 30 controls the functions of the monitoring system 24, and may be any one of several known CPU devices. The input device 32 is configured to receive input from a human operator (e.g., an operator of the monitoring system 24, the process tool 22, and/or the semiconductor wafer fabrication system 20). The input device 32 may be, for example, a keyboard or a mouse. The monitor 34 is a display device, and may include, for example, a cathode ray tube (CRT), a liquid crystal display (LCD), or the like.

The interface 28 is an interface device that communicates with the process tool 22 (e.g., via electrical signals). For example, the interface 28 may communicate with the process tool 22 according to the Semiconductor Equipment and Materials International (SEMI, San Jose, Calif.) equipment communication standard II (SECS II), in which case the interface 28 may comprise a SEMI E5. The SECS II standard specifies a group of messages, and the respective syntax and semantics, for messages relating to semiconductor manufacturing equipment control. It is noted that other suitable communication standards exist, and are intended to come within the scope of the present invention.

The storage system 36 is used to store software program instructions and data within the monitoring system 24. The storage system 36 may include, for example, a hard disk drive (HDD), a compact disk read only memory (CD-ROM), dynamic random access memory (DRAM), and/or electrically erasable programmable read only memory (EEPROM).

In the embodiment of FIG. 1, the storage system 36 is used to store a database 40 and several software modules, including a retrieving module 38, a calculating module 42, a selecting module 44, a comparing module 46, an output module 48, an updating module 50, and a diagram generating module 52. As is typical of computer systems, the CPU 30 accesses the software modules in the storage system 36, and executes program instructions within the software modules. While executing program instructions of a given software module, the CPU 30 implements functions embodied within the program instructions.

It is noted that the functions embodied within the software modules, described in detail below, may be embodied within hardware, such as an application specific integrated circuit (ASIC), without departing from the spirit and scope of the invention.

The retrieving module 38 retrieves parameter data from the process tool 22 via the interface 28, and stores the parameter data in the database 40. In general, the parameter data includes operating data of the process tool 22 used for example to calculate a throughput of the process tool 22. The retrieving module 38 may, for example, retrieve parameter data from the process tool 22 at various times during and after the processing of the one or more semiconductor wafers 26, and the parameter data may be accumulated in the database 40. Alternately, the process tool 22 may accumulate the parameter data, and the retrieving module 38 may retrieve the cumulative parameter data from the process tool 22 all at once after the processing of the one or more semiconductor wafers 26.

In one particular embodiment of the semiconductor wafer fabrication system 20 of FIG. 1, the process tool 22 is a furnace, and is used to heat the one or more semiconductor wafers 26. In this embodiment, the parameter data includes furnace temperature data indicating temperatures within the furnace at different times during the processing of the one or more semiconductor wafers 26. In addition, the parameter data includes wafer load time data, indicating a time of day at which the semiconductor wafers 26 were loaded into the furnace, and wafer unload time data, indicating a time of day at which the semiconductor wafers 26 were unloaded from the furnace.

In the particular embodiment described above, the database 40 is used to store the parameter data, as well as constant standard parameter data and real-time standard parameter data. In general, the constant standard parameter data and the real-time standard parameter data include the studies of the motions (temperature changing, wafer loading/unloading, etc.) in the furnace process tool 22. More particularly, the constant standard parameter data includes general processing information (e.g., process tool identification information, recipe identification information, processing date, etc.), and the real-time standard parameter data includes average values of the parameter data. In one embodiment, the constant standard parameter data comprises basic records and the real-time standard parameter data comprises actual records. In Table 1 below includes exemplary parameter data.

TABLE 1

Exemplary Database 40 Fields and Definitions.

| Field No. | Field Id. | Definition |
|---|---|---|
| 1 | Date | (date) |
| 2 | Tool_id | (tool id.) |
| 3 | Batch_id | (batch id.) |
| 4 | Recipe_id | (recipe id.) |
| 5 | Batch_size | Lot release Qty (4 or 6) |
| 6 | Oper_no | (operation number) |
| 7 | Oper_nm | (operation number) |
| 8 | Lot_id | (lot id.) |
| 9 | Route_id | (route id.) |
| 10 | Prod_id | (product id.) |
| 11 | Lot_Wfr_qty | actual release wafer qty. (for each lot) |
| 12 | Port_id | the port name that pod loaded (for each lot) |
| 13 | position | the position that cassette loaded (for each lot) |
| 14 | T_LPod_on | time stamp of pod on (for each lot) |
| 15 | T_Load_start | time stamp of load started (for each lot) |
| 16 | T_Load_comp | time stamp of load completed (for each lot) |
| 17 | T_LPod_off | time stamp of pod off after loaded (for each lot) |
| 18 | T_Recipe_setup | time stamp of change recipe setup |
| 19 | Chang recipe Temp | the final tube temperature after recipe setup |
| 20 | T_Char_start | time stamp of wafer charging started (for a batch) |
| 21 | Standby Temp | the final tube temperature after charge start |
| 22 | T_Char_comp | time stamp of wafer charging completed (for a batch) |
| 23 | T_Push_start | time stamp of pushing boat started (for a batch) |
| 24 | T_Push_comp | time stamp of pushing boat completed (for a batch) |
| 25 | T_Proc_start | time stamp of processing started (for a batch) |
| 26 | T_Proc_comp | time stamp of processing completed (for a batch) |
| 27 | End Temp | the final tube temperature after processed |
| 28 | T_Pull_start | time stamp of pulling boat started (for a batch) |
| 29 | T_Pull_comp | time stamp of pulling boat completed (for a batch) |
| 30 | T_Dischar_start | time stamp of wafer discharging started (for a batch) |
| 31 | T_Dischar_comp | time stamp of wafer discharging completed (for a batch) |
| 32 | T_Unload_ready | time stamp of unloaded ready (for each lot) |
| 33 | T_UPod_on | time stamp of pod on (for each lot) |
| 34 | T_Unload_start | time stamp of unload started (for each lot) |
| 35 | T_Unload_comp | time stamp of unload completed (for each lot) |
| 36 | T_UPod_off | time stamp of pod off after unloaded (for each lot) |
| 37 | Run Type | flag of single run or batch run |
| 38 | Batch run Type | Detailed description of batch run |

It is noted that the term "batch" in Table 1 above refers to one or more wafer "lots."

The calculating module 42 uses the parameter data to calculate a present throughput data, e.g. in wafers per hour (WPH). For example, one can obtain a total amount of time "T1" (i.e., the standard time) for the entire process, including wafer loading and unloading. After wafer processing, one can obtain an amount of time "T2" the process tool spent carrying out processing operations. One can use T1 and T2 to calculate process tool throughput. For example, if T1 and T2 are derived from the parameter data and measured in hours, and N1 wafers are processed, a "present" process tool throughput value can be calculated as (T2/T1)*N1 wafers per hour (WPH).

In the embodiment of FIG. 1, the calculating module 42 also uses the constant standard parameter data and the real-time standard parameter data to calculate a "standard throughput data" (i.e., a standard throughput value). For example, if T1 and T2 are derived from the real-time standard parameter data and measured in hours, and N1 wafers are processed, the "standard" throughput value is calculated as (T2/T1)*N1 wafers per hour (WPH).

The selecting module 44 selects an analysis parameter dependent upon an operator input received via the input device 32. The comparing module 46 compares the standard throughput data and the present throughput data dependent upon the operator-selected analysis parameter, and generates a comparison report.

In the embodiment of FIG. 1, the output module 48 provides the standard throughput data, the present throughput data, and the comparison report to the operator (e.g., via the monitor 34). The output module 48 can further provide the parameter data to the operator. For example, in the particular embodiment described above, the parameter data includes furnace temperature data, wafer load time data, and wafer unload time data.

The updating module 50 combines the real-time standard parameter data and the parameter data, thereby updating the real-time standard parameter data.

The diagram generating module 52 generates a throughput diagram based upon the standard throughput data and the present throughput data, and provides the throughput diagram to the output module 48. The throughput diagram may indicate, for example, intervals of time when the process tool 22 was operating, and intervals of time when the process tool 22 was idle. The output module 48 provides the throughput diagram to the operator (e.g., via the monitor 34).

Figure 2:
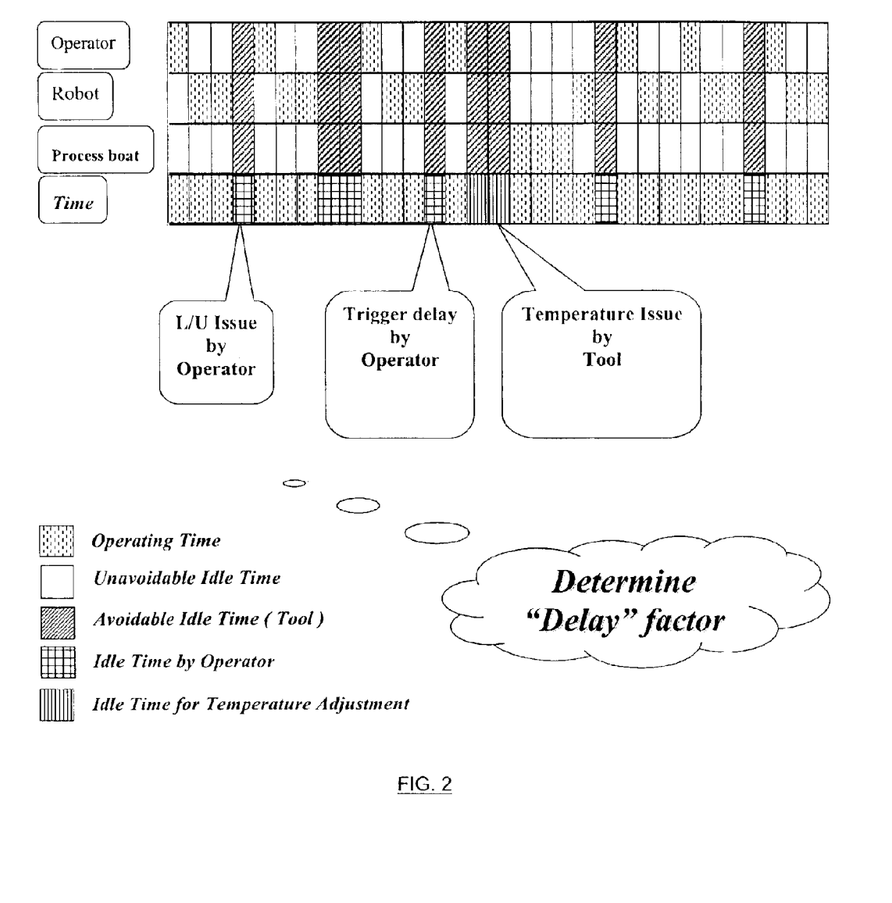
FIG. 2 shows an exemplary throughput diagram generated by the monitoring system for a furnace process tool.

FIG. 2 shows an exemplary throughput diagram for a furnace process tool, wherein the throughput diagram indicates intervals of time during which the furnace was operating, and intervals of time during which the furnace was idle. In the illustrated throughput diagram, a first occurrence of an operator idle-time delay is indicated followed by another occurrence of an operator trigger delay. A third idle-time occurrence resulting from a temperature issue of the process tool is labeled in the figure.

Figure 3A:
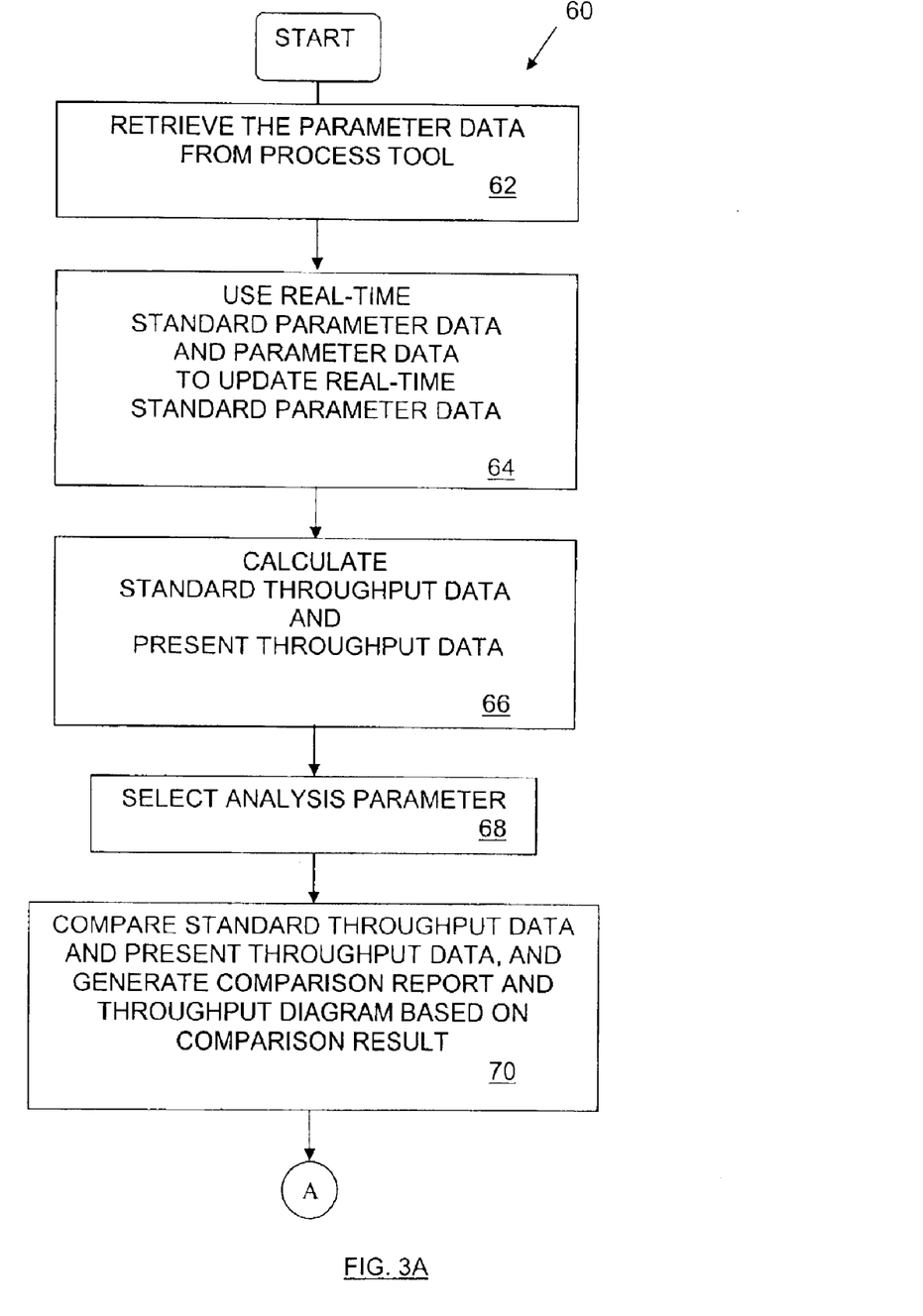
FIGS. 3A–3B in combination form a flow chart of a method for monitoring a process tool.
Figure 3B:
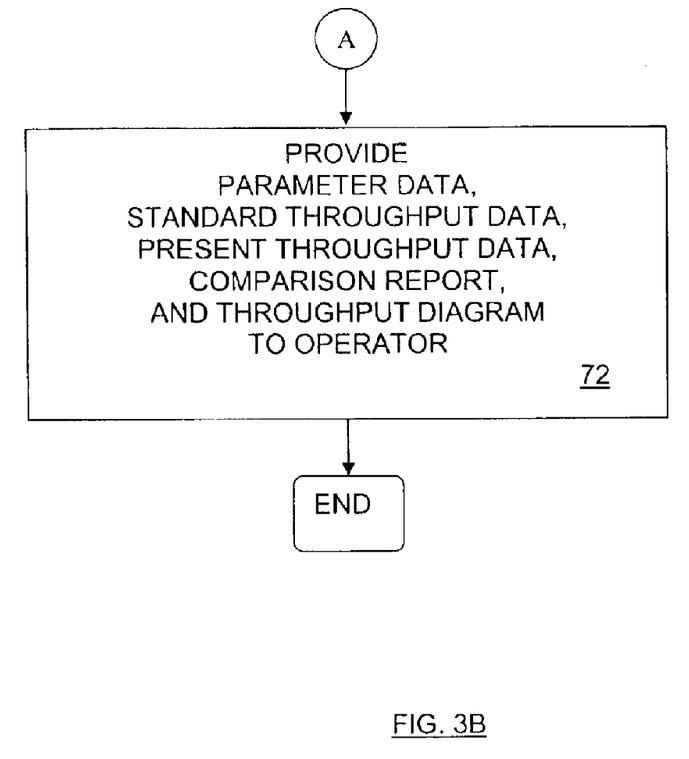

FIGS. 3A–3B in combination form a flow chart of an exemplary method 60 for monitoring a process tool (e.g., the process tool 22 in FIG. 1). The method 60 may be embodied within the software modules of the monitoring system 24 (FIG. 1), and may be carried out by the monitoring system 24 when the monitoring system 24 and the process tool 22 are operational.

During an operation 62 of the method 60, the parameter data, such as the furnace temperature data and the wafer load/unload data, is retrieved from the process tool (e.g., by the retrieving module 38 in FIG. 1), and the parameter data is stored in the database 40 (FIG. 1). The real-time standard parameter data and the parameter data are combined to update the real-time standard parameter data during an operation 64. During an operation 66, the present throughput data is calculated dependent upon the parameter data, and the standard throughput data is calculated dependent upon the constant standard parameter data and the real-time standard parameter data. The analysis parameter, such as furnace temperature data, wafer load time data, and/or wafer unload time data, is selected dependent upon operator input during an operation 68. During an operation 70, the standard throughput data and the present throughput data are compared, and the comparison report and the throughput diagram are generated. The furnace temperature data, the wafer load time data, the wafer unload time data, the standard throughput data, the present throughput data, the comparison report, and the throughput diagram are provided to the operator (e.g., via the monitor 34 in FIG. 1).

Referring back to FIG. 1, the monitoring system 24 may also be used to monitor multiple process tools, and to compare their throughputs. In FIG. 1, the monitoring system 24 is coupled to, and in communication with, the process tool 22 as described above, and a second process tool 54. Like the process tool 22, the second process tool 54 is configured to receive one or more semiconductor wafers, and to perform a wafer fabrication operation on the semiconductor wafers.

The retrieving module 38 may be configured to retrieve parameter data from the process tool 22 as described above, and from the process tool 54. The database 40 may store parameter data, constant standard parameter data, and real-time standard parameter data associated with the process tool 22, and parameter data, constant standard parameter data, and real-time standard parameter data associated with the process tool 54. The calculating module 42 may calculate a present throughput data for the process tool 22 as described above, and a present throughput data for the process tool 54 dependent upon the parameter data received from the process tool 54 and stored in the database 40. The calculating module 42 may further calculate a standard throughput data for the process tool 22 as described above, and a standard throughput data for the process tool 54 dependent upon the constant standard parameter data and the real-time standard parameter data associated with the process tool 54.

The comparing module 46 may compare the standard throughput data and present throughput data of the process tool 22 and of the process tool 54 dependent upon the selected analysis parameter(s), and generate a comparison report(s) which compares the present throughput data of the process tool 22 and the process tool 54 and/or which provides a throughput difference between the process tool 22 and the process tool 54. The output module 48 may provide the standard throughput data and present throughput data of the process tool 22 and the process tool 54, comparison report(s) comparing the present throughput data of the process tool 22 and the process tool 54, and throughput diagram(s), to the operator (e.g., via the monitor 34).

The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A process tool monitoring system, comprising:
   a retrieving module in communication with a process tool and configured to retrieve parameter data from the process tool, and to store the parameter data in a database that also stores constant standard parameter data and real-time standard parameter data;
   a calculating module configured to access the parameter data within the database, and to calculate a present throughput data dependent upon the parameter data, wherein the present throughput data is indicative of a present throughput of the process tool, the calculating module further being configured to access the constant standard parameter data and the real-time standard parameter data within the database, and to calculate a standard throughput data dependent upon the constant standard parameter data and the real-time standard parameter data, wherein the standard throughput data is standard throughput; and
   an output module configured to provide the present throughput data and the standard throughput data to an operator of the process tool.

2. The process tool monitoring system as recited in claim 1, wherein the parameter data comprises operating data of the process tool.

3. The process tool monitoring system as recited in claim 1, wherein the process tool monitoring system further comprises the database.

4. The process tool monitoring system as recited in claim 1, wherein the constant standard parameter data comprises general processing information, and the real-time standard parameter data comprises average values of the parameter data.

5. The process tool monitoring system as recited in claim 1, further comprising:
   a selecting module configured to select an analysis parameter dependent upon input from an operator; and
   a comparing module configured to compare the standard throughput data and the present throughput data dependent upon the selected analysis parameter.

6. The process tool monitoring system as recited in claim 5, wherein the output module is configured to provide a comparison report to an operator, the comparison report being generated by the comparing module based upon a comparison of the standard throughput data and the present throughput data.

7. The process tool monitoring system as recited in claim 3, further comprising an updating module configured to access the parameter data and the real-time standard parameter data, and to use the real-time standard parameter data and the parameter data to update the real-time standard parameter data within the database.

8. The process tool monitoring system as recited in claim 7, wherein:
   the process tool is a furnace;
   the parameter data comprises furnace temperature data, wafer load time data and wafer unload time data;
   the output module is configured to provide the furnace temperature data, the wafer load time data and the wafer unload time data to the operator; and
   the updating module combines the real-time standard parameter data and the parameter data to update the real-time standard parameter data within the database.

9. The process tool monitoring system as recited in claim 6, wherein:
   the retrieving module is further configured to retrieve another parameter data from another process tool;
   the database further stores the other parameter data;
   the calculating module further calculates another present throughput data according to the other parameter data;

the comparing module further compares the present throughput data and the other present throughput data according to the analysis parameter, and provides another comparison report; and the output module further provides the other present throughput data and the other comparison report to an operator.

10. The process tool monitoring system as recited in claim 1, further comprising a diagram generating module configured to generate a throughput diagram dependent upon the standard throughput data and the present throughput data, and wherein the output module is configured to provide the throughput diagram to the operator.

11. A process tool monitoring system, comprising:

a database for storing parameter data, constant standard parameter data, and real-time standard parameter data, wherein the parameter data comprises operating data of a process tool, and wherein the constant standard parameter data comprises general processing information, and wherein the real-time standard parameter data comprises average values of the parameter data;

a retrieving module in communication with the process tool and configured to retrieve the parameter data from the process tool, and to store the parameter data in the database;

a calculating module configured to access the parameter data, the constant standard parameter data, and the real-time standard parameter data, to calculate a present throughput data dependent upon the parameter data, wherein the present throughput data is indicative of a present throughput of the process tool, and to calculate a standard throughput data dependent upon the constant standard parameter data and the real-time standard parameter data, wherein the standard throughput data is standard throughput;

a selecting module configured to select an analysis parameter dependent upon input from an operator of the process tool;

a comparing module configured to compare the standard throughput data and the present throughput data dependent upon the analysis parameter, and to generate a comparison report; and an output module configured to provide the present throughput data, the standard throughput data, and the comparison report to the operator.

12. The process tool monitoring system as recited in claim 11, further comprising an update module configured to access the parameter data and the real-time standard parameter data, and to use the real-time standard parameter data and the parameter data to update the real-time standard parameter data.

13. The process tool monitoring system as recited in claim 11, further comprising a diagram generating module configured to generate a throughput diagram dependent upon the standard throughput data and the present throughput data, and wherein the output module is configured to provide the throughput diagram to the operator.

14. The process tool monitoring system as recited in claim 11, wherein the process tool is a furnace, and wherein the parameter data comprises at least one of furnace temperature data, wafer load time data and wafer unload time data, and wherein the output module is configured to provide at least one of the furnace temperature data, the wafer load time data and the wafer unload time data to the operator.

15. A process tool monitoring system, comprising:

a retrieving module in communication with a first process tool and a second process tool, wherein the retrieving module is configured to retrieve first parameter data from the first process tool and second parameter data from the second process tool, and to store the first and second parameter data in a database;

a calculating module configured to access the first parameter data and the second parameter data, and to calculate: (i) a first present throughput data dependent upon the first parameter data, wherein the first present throughput data is indicative of a present throughput of the first process tool, and (ii) a second present throughput data dependent upon the second parameter data, wherein the second present throughput data is indicative of a present throughput of the second process tool; (iii) a first standard throughput data dependent upon general processing information and average values of the first parameter data, and (iv) a second standard throughput data dependent upon general processing information and average values of the second parameter data; and an output module configured to provide the first present throughput data and the second present throughput data to an operator.

16. A process tool monitoring method, comprising:

retrieving parameter data from a process tool, wherein the parameter data comprises operating data of the process tool;

calculating a present throughput data dependent upon the parameter data;

providing the present throughput data to an operator of the process tool calculating a standard throughput data dependent upon constant standard parameter data and real-time standard parameter data, wherein the constant standard parameter data comprises general processing information, and wherein the real-time standard parameter data comprises average values of the parameter data;

selecting an analysis parameter dependent upon input from an operator;

comparing the standard throughput data and the present throughput data dependent upon the analysis parameter, and generating a comparison report dependent upon a result of the comparing; and providing the standard throughput data and the comparison report to an operator.

17. The process tool monitoring method as recited in claim 16, further comprising using the real-time standard parameter data and the parameter data to update the real-time standard parameter data.

18. The process tool monitoring method as recited in claim 17, wherein the using comprises combining the real-time standard parameter data and the parameter data.

19. The process tool monitoring method as recited in claim 16, further comprising:

generating a throughput diagram dependent upon the standard throughput data and the present throughput data; and providing the throughput diagram to an operator.

20. The process tool monitoring method as recited in claim 19, wherein the process tool is a furnace and wherein the parameter data comprises furnace temperature data, wafer load time data, and wafer unload time data, all of which are provided to an operator.

21. The process tool monitoring method as recited in claim 16, further comprising:
   retrieving another parameter data from another process tool;
   calculating another present throughput data dependent upon the other parameter data; and
   providing the other present throughput data to the operator.

22. The process tool monitoring method as recited in claim 21, further comprising:
   comparing the present throughput data and the other present throughput data dependent upon the analysis parameter, and generating another comparison report; and
   providing the other present throughput data and the other comparison report to an operator along with the present throughput data.

23. The process tool monitoring system as recited in claim 15, wherein:
   the first standard throughput data is dependent upon constant standard parameter data and real-time standard parameter data associated with the first process tool; and
   the second standard throughput data is dependent upon constant standard parameter data and real-time standard parameter data associated with the second process tool.

* * * * *